United States Patent
Park et al.

(10) Patent No.: US 7,622,971 B2
(45) Date of Patent: Nov. 24, 2009

(54) DELAY LOCKED LOOP CIRCUITS AND METHODS OF GENERATING CLOCK SIGNALS

(75) Inventors: Moon-Sook Park, Seocho-gu (KR); Young-Don Choi, Anseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/761,464

(22) Filed: Jun. 12, 2007

(65) Prior Publication Data

US 2008/0024180 A1   Jan. 31, 2008

(30) Foreign Application Priority Data

Jul. 31, 2006   (KR) ...................... 10-2006-0072291

(51) Int. Cl.
  *H03L 7/00* (2006.01)
(52) U.S. Cl. ...................... 327/161; 327/158; 327/149; 327/150; 327/152; 327/153; 327/159
(58) Field of Classification Search ................. 327/158, 327/149, 150, 152, 153, 159, 161
See application file for complete search history.

(56) References Cited

U.S. PATENT DOCUMENTS

2002/0070409 A1*  6/2002  Yonemaru ................... 257/365
2007/0024335 A1*  2/2007  Sato .......................... 327/158

FOREIGN PATENT DOCUMENTS

| KR | 1020030014790 A | 2/2003 |
| KR | 1020030062480 A | 7/2003 |
| KR | 1020040093819 A | 9/2004 |

* cited by examiner

*Primary Examiner*—Lincoln Donovan
*Assistant Examiner*—Daniel Rojas
(74) *Attorney, Agent, or Firm*—Volentine & Whitt, PLLC

(57) ABSTRACT

A delay locked loop circuit includes a phase detector configured to compare a phase of a reference clock signal with a phase of an output clock signal and to output a comparison signal, a control voltage generator configured to output a control voltage based on the comparison signal, a voltage controlled delay line comprising a plurality of delay elements and configured to delay the reference clock signal based on the control voltage and to output the output clock signal, and a control voltage initializer configured to generate digital codes based on characteristics of the voltage controlled delay line and to generate an initial control voltage based on the digital codes.

16 Claims, 13 Drawing Sheets

DELAY LOCKED LOOP CIRCUITS AND METHODS OF GENERATING CLOCK SIGNALS

BACKGROUND OF THE INVENTION

1. Field of the Invention

The present invention generally relates to semiconductor integrated circuits, and more particularly, the present invention relates to delay locked loop (DLL) circuits and to methods of generating clock signals using DLL circuits.

A claim of priority is made to Korean Patent Application No. 10-2006-0072291, filed on Jul. 31, 2006, in the Korean Intellectual Property Office, the disclosure of which is incorporated herein in its entirety by reference.

2. Description of the Related Art

FIG. 1 is a block diagram of a conventional delay locked loop (DLL) circuit 100 which functions to synchronize the phase of an input clock signal with the phase of a delayed output clock signal. As shown, the DLL circuit 100 includes a voltage controlled delay line (VCDL) 110, a phase detector 120, and a control voltage generator 130.

The VCDL 110 includes a plurality (e.g., four in FIG. 1) of delay elements which are connected in series, and a delay time of the VCDL 110 is controlled by a control voltage Vctrl output by the control voltage generator 130. The VCDL 110 delays an externally supplied reference clock signal ref_clk and generates a resultant output clock signal clk_out.

The phase detector 120 compares the phase of the reference clock signal ref_clk with the phase of the output clock signal clk_out and outputs an "up" signal and a "dn" signal in accordance with a comparison result. The control voltage generator 130 is responsive to the "up" and "dn" signals to increase and decrease the control voltage Vctrl, thereby controlling the delay time of VCDL 110. In this manner, output clock signal clk_out is made to synchronize with the reference clock signal ref_clk.

FIGS. 2A through 2C are timing diagrams for further explaining an operation of the DLL circuit 100 of FIG. 1. In the examples shown, the output clock signal clk_out is delayed by one clock cycle relative to the reference clock signal ref_clk. Referring to FIG. 2A, the phase detector 120 outputs the "up" signal when a leading edge of the clock signal ref_clk is advanced relative to a leading edge of the reference clock signal ref_clk, and the control voltage generator 130 is responsive thereto to decrease the delay of the VCDL 110. On the other hand, referring to FIG. 2B, the phase detector 120 outputs the "down" signal when the leading edge of the clock signal ref_clk lags behind the leading edge of the reference clock signal ref_clk, and the control voltage generator 130 is responsive thereto to increase the delay of the VCDL 110. Finally, as shown in FIG. 2C, neither the "up" signal nor the "down" signal is output by the phase detector 120 when the output clock signal clk_out is in phase with the reference clock signal ref_clk.

FIG. 3 is a circuit diagram of the control voltage generator 130 shown in FIG. 1. Referring to FIG. 3, the control voltage generator 130 includes a charge pump 131 and a loop filter 132. The charge pump 131 performs charge pumping in response to the "up" signal and the "dn" signal. In operation, when the "up" signal is at a high level, a switch 31 is turned on and current is supplied from a current source 33 to charge one or more capacitive elements of the loop filter 132, thereby increasing the control voltage Vctrl. On the other hand, when the "dn" signal is at a high level, a switch 32 is turned on and current is discharged from the one or more capacitive elements of the loop filter 132 via a current source 34, thereby decreasing the control voltage Vctrl. The switches 31 and 32 may, for example, be implemented by a PMOS transistor and an NMOS transistor, respectively. The current sources 33 and 34 may, for example, also be implemented by a PMOS transistor and an NMOS transistor, respectively.

The loop filter 132 functions a low-pass filter which removes alternating current (AC) components from the control voltage Vctrl.

When the phase of the reference clock signal ref_clk is the same as the phase of the output clock signal clk_out, the phase detector 120 does not output a pulse stream (see FIG. 2C) and the delay of the VCDL 110 is held constant. This state is referred to as a locking state in which the DLL circuit 100 desirably outputs a stable clock signal. Accordingly, it is important to enter the locking state quickly. In practicality, however, it takes multiple clock cycles for the conventional DLL circuit 100 to achieve a locking state. Further, as explained next, the conventional DLL circuit 100 has a limited locking range locking range.

FIGS. 4A and 4B are timing diagrams for explaining the locking range limits of the conventional DLL circuit 100. In the figures, the DLL circuit 100 is designed to delay the reference clocks signal ref_clk by a time period Tref equal to one clock cycle.

FIG. 4A illustrates the case where the leading edge of the output clock signal clk_out lags behind the leading edge of the reference clock signal ref_clk by an amount exceeding 0.5 Tref (one-half clock cycle). In this state, the phase detector 120 erroneously outputs the "up" signal, which causes the output clock signal to further lag behind the reference clock signal ref_clk. Eventually, a state is reached where the VCDL circuit is set to a minimum delay time Tdmin, the "up" signal is repeatedly output from the phase detector 120 at each clock cycle, and a locking state thus cannot be realized.

FIG. 4B illustrates the case where the leading edge of the output clock signal clk_out is advanced beyond the leading edge of the reference clock signal ref_clk by an amount exceeding 0.5 Tref (one-half clock cycle). In this state, the phase detector 120 erroneously outputs the "dn" signal, which causes the output clock signal to further advance ahead of the reference clock signal ref_clk. Eventually, a state is reached where the VCDL circuit is set to a maximum delay time Tdmax, and the "dn" signal is repeatedly output from the phase detector 120 at each clock cycle. Thus, a locking state cannot be achieved.

In addition to exhibiting a limited locking range, the conventional DLL circuit 100 can suffer the drawback of unstable harmonic locking, for example, in which the output clock signal clk_out is locked two cycles out of phase (rather than one cycle) relative to the reference clock signal ref_clk.

SUMMARY OF THE INVENTION

According to one or more embodiments of the present invention, a delay locked loop circuit is provided which includes a phase detector configured to compare a phase of a reference clock signal with a phase of an output clock signal and to output a comparison signal, a control voltage generator configured to output a control voltage based on the comparison signal, a voltage controlled delay line comprising a plurality of delay elements and configured to delay the reference clock signal based on the control voltage and to output the output clock signal, and a control voltage initializer configured to generate digital codes based on characteristics of the voltage controlled delay line and to generate an initial control voltage based on the digital codes.

The control voltage generator may, for example, include a charge pump configured to change a level of the control voltage by performing charge pumping based on the comparison signal, a loop filter configured to perform low-pass filtering, and a selector configured to selectively input one of an output from the charge pump and the initial control voltage to the loop filter based on the control signal.

The characteristics of the voltage controlled delay line may, for example, be based on a minimum delay voltage, which minimizes a delay of the reference clock signal, and a maximum delay voltage, which maximizes the delay of the reference clock signal.

The control voltage initializer may, for example, include a reference clock divider configured to divide the reference clock signal by K and to output a divided reference clock signal, where K is 2 or a natural number greater than 2; a first replica voltage controlled delay line comprising M second delay elements connected in series and configured to receive the reference clock signal and to output first reference clock delay signals from the respective M second delay elements in response to the minimum delay voltage, where M is a natural number; a second replica voltage controlled delay line comprising N third delay elements connected in series and configured to receive the reference clock signal and to output second reference clock delay signals from the respective N third delay elements in response to the maximum delay voltage, where N is a natural number; a code generator configured to generate and output an initial voltage digital code based on the divided reference clock signal, the first reference clock delay signals, and the second reference clock delay signals; and an initial control voltage generator configured to generate the initial control voltage in response to the initial voltage digital code.

The code generator may, for example, include a latch configured to sample the divided reference clock signal in response to the first reference clock delay signals and the second reference clock delay signals and to output a first digital code and a second digital code, and a comparator configured to compare the first digital code and the second digital code with a locking digital code and to generate the initial voltage digital code.

According to one or more other embodiments of the present invention, a method of generating a clock signal in a delay locked loop circuit is provided. The method includes comparing a phase of a reference clock signal with a phase of an output clock signal, and outputting a comparison signal, outputting a pre-control voltage based on the comparison signal, generating an initial control voltage based on a digital code generated in response to the reference clock signal, a minimum delay voltage, and a maximum delay voltage, and outputting the output clock signal by delaying the reference clock signal in response to one of the pre-control voltage and the initial control voltage.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF EMBODIMENTS

Figure 1:
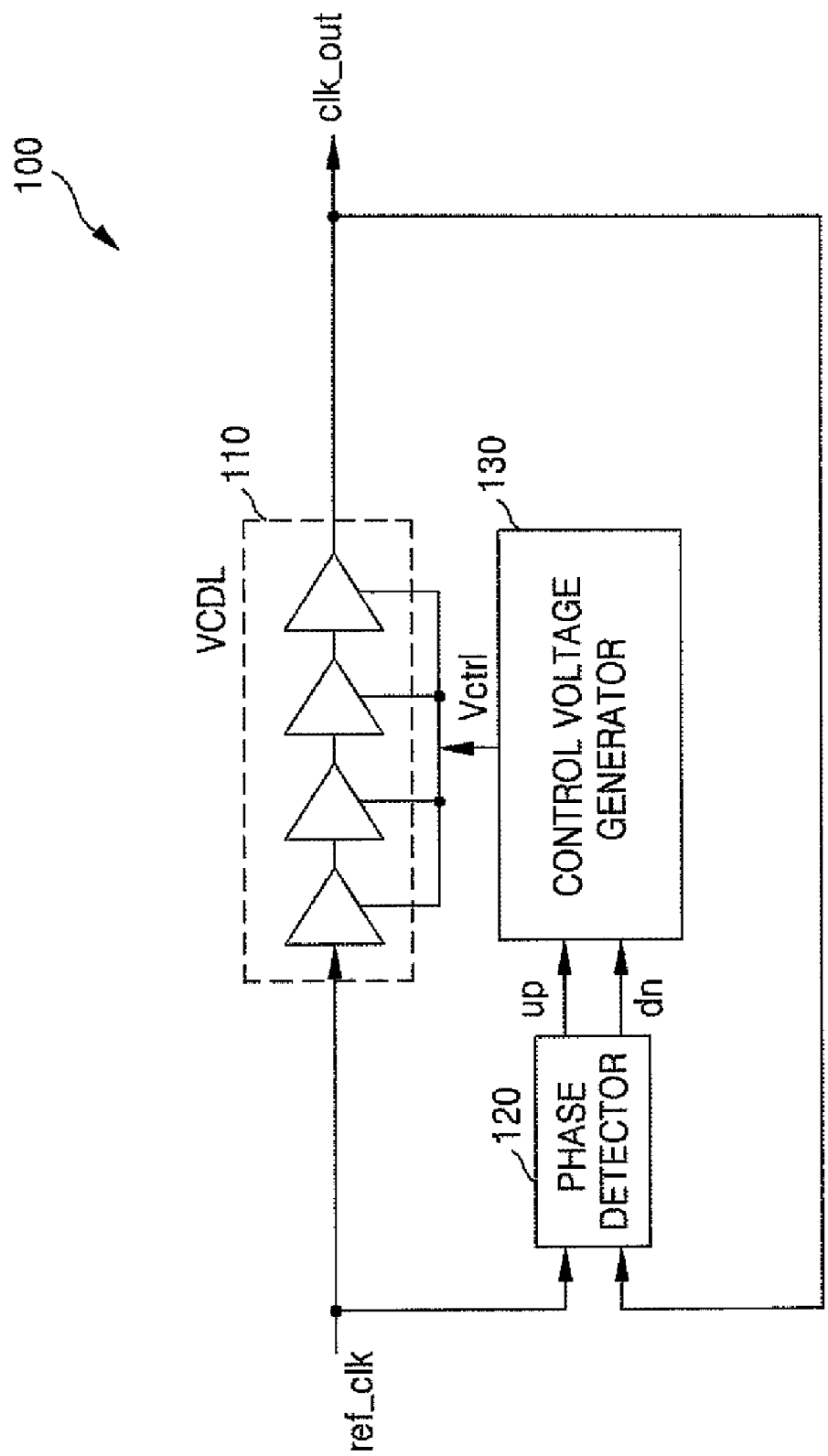
FIG. 1 is a block diagram of a conventional delay locked loop (DLL) circuit.
Figure 2A:
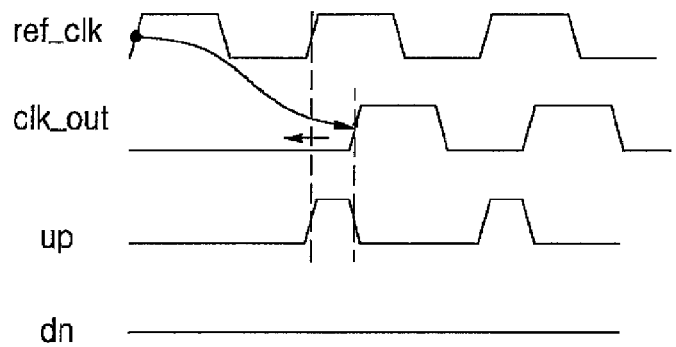
FIGS. 2A through 2C are timing diagrams for explaining an operation of the conventional DLL circuit shown in FIG. 1.
Figure 2B:
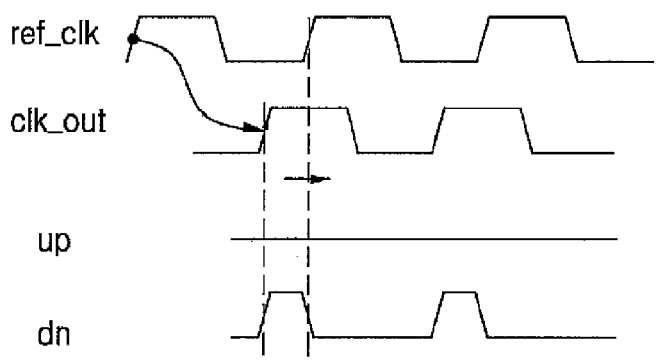
Figure 2C:
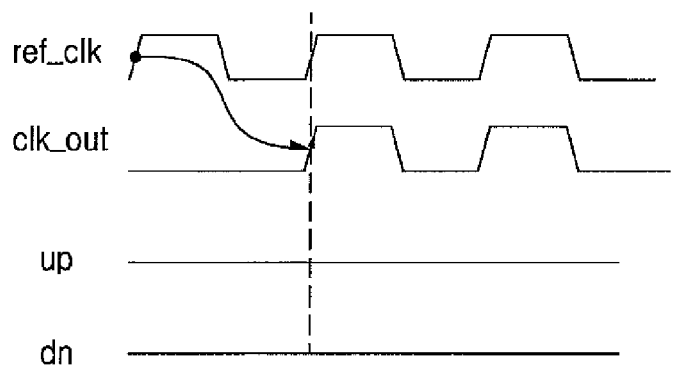
Figure 3:
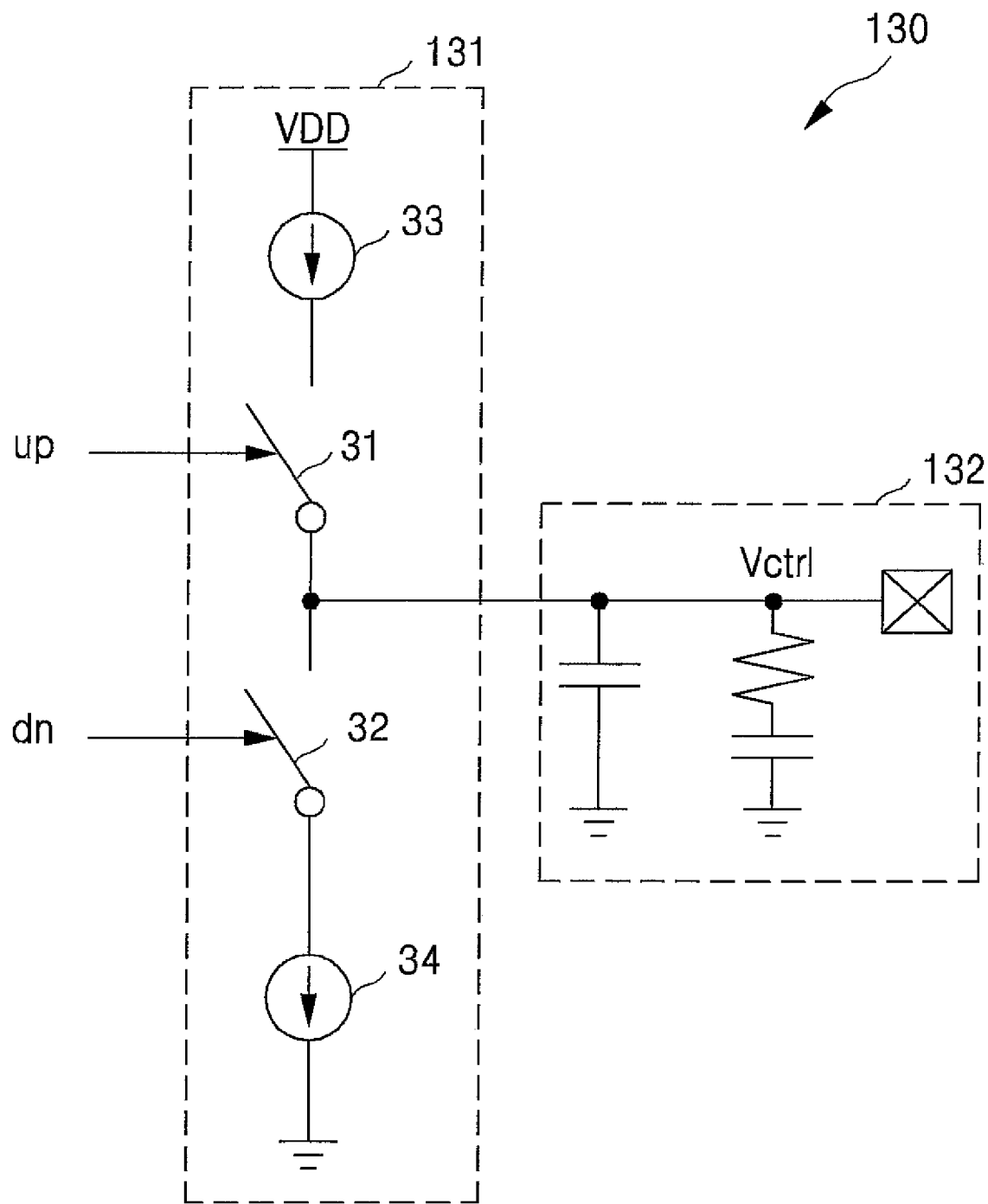
FIG. 3 is a circuit diagram of a control voltage generator of the conventional DLL circuit illustrated in FIG. 1.
Figure 4A:
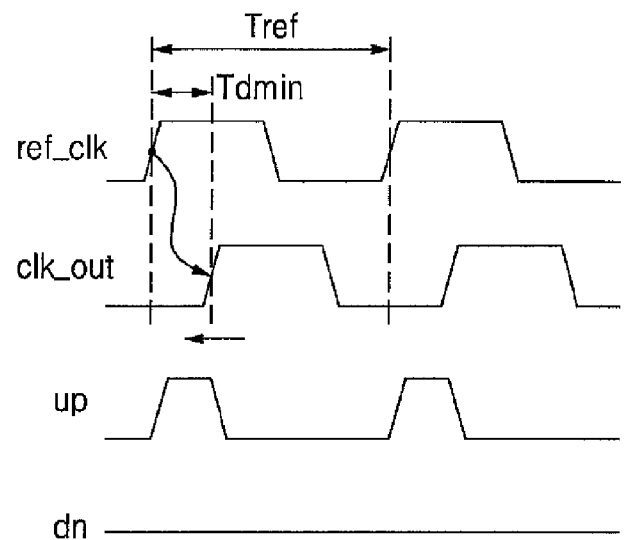
FIGS. 4A and 4B are timing diagrams for explaining locking range limits of the conventional DLL circuit shown in FIG. 1.
Figure 4B:
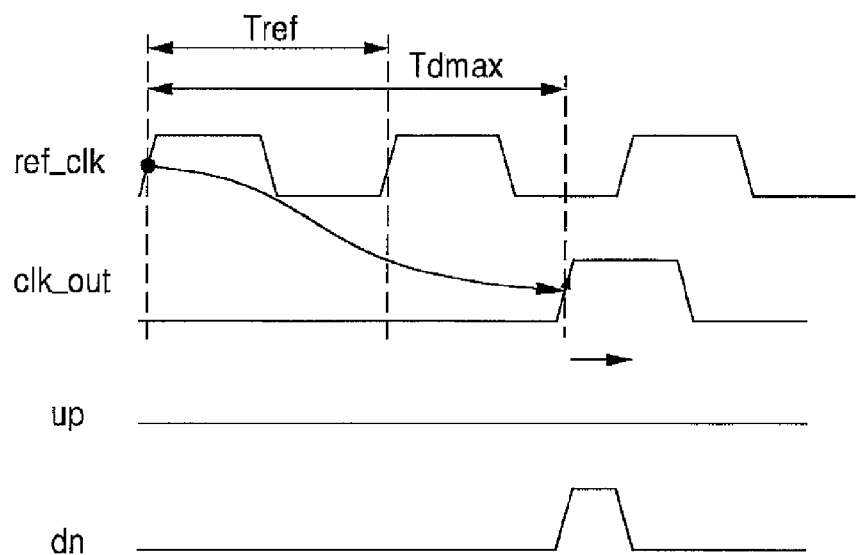

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 5:
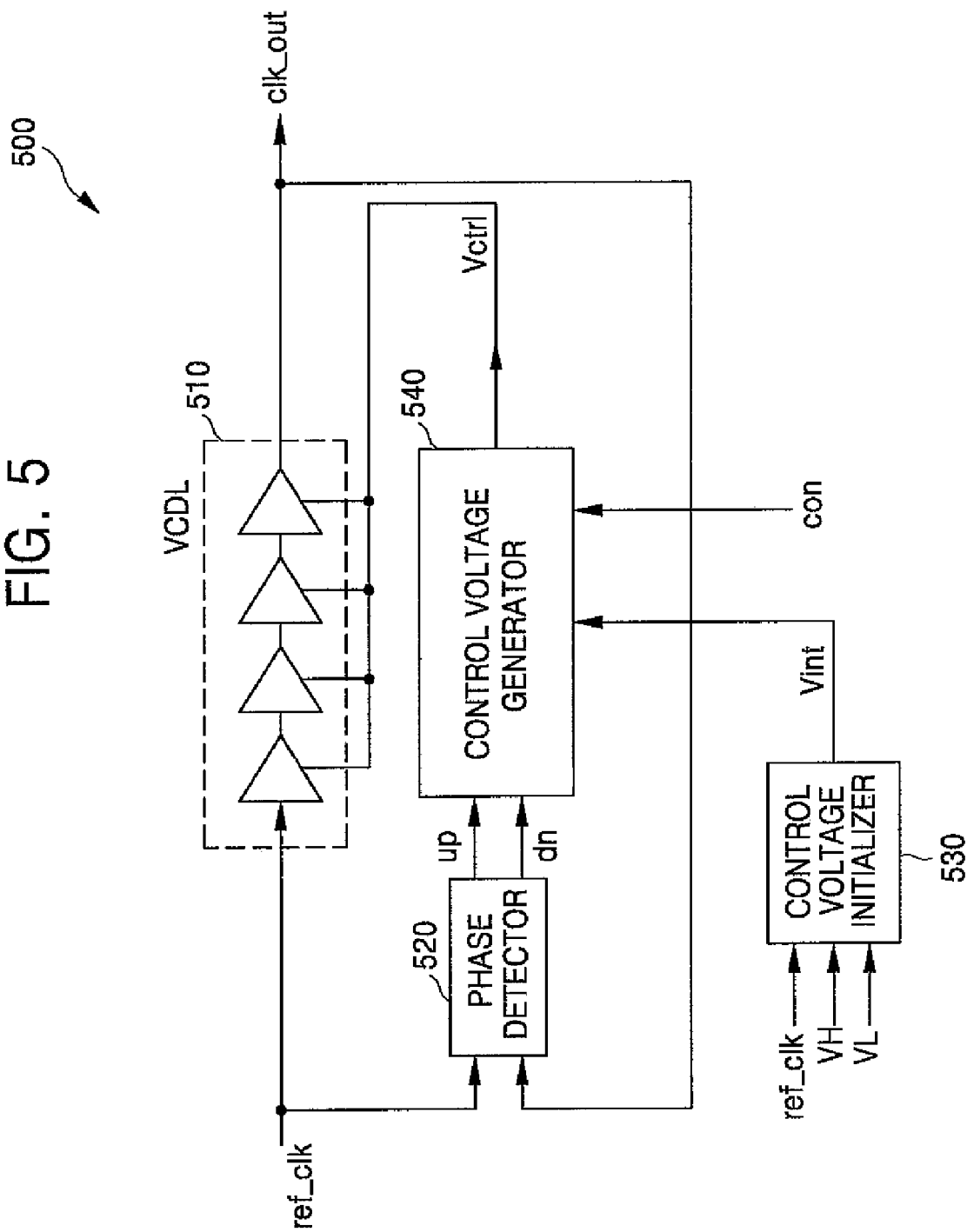
FIG. 5 is a block diagram of a DLL circuit according to one or more embodiments of the present invention.

FIG. 5 is a block diagram of a delay locked loop (DLL) circuit 500 according to one or more embodiments of the present invention. Referring to FIG. 5, the DLL circuit 500 includes a voltage controlled delay line (VCDL) 510, a phase detector 520, a control voltage initializer 530, and a control voltage generator 540.

The VCDL 510 includes a plurality (e.g., four) of delay elements which are connected in series and controlled by a control voltage Vctrl. The VCDL 510 delays an externally supplied reference clock signal ref_clk and outputs a corresponding output clock signal clk_out.

The phase detector 520 compares the phase of the reference clock signal ref_clk with the phase of the output clock signal clk_out, and outputs an "up" signal and a "dn" signal according to a phase comparison result.

The control voltage initializer 530 generates an initially control voltage Vint according to a number of digital codes which are based on characteristics of the VCDL 510.

The control voltage generator 540 receives the "up" signal, the "dn" signal, and the initial control voltage Vint, and generates the control voltage Vctrl in response to a control signal "con".

Figure 6:
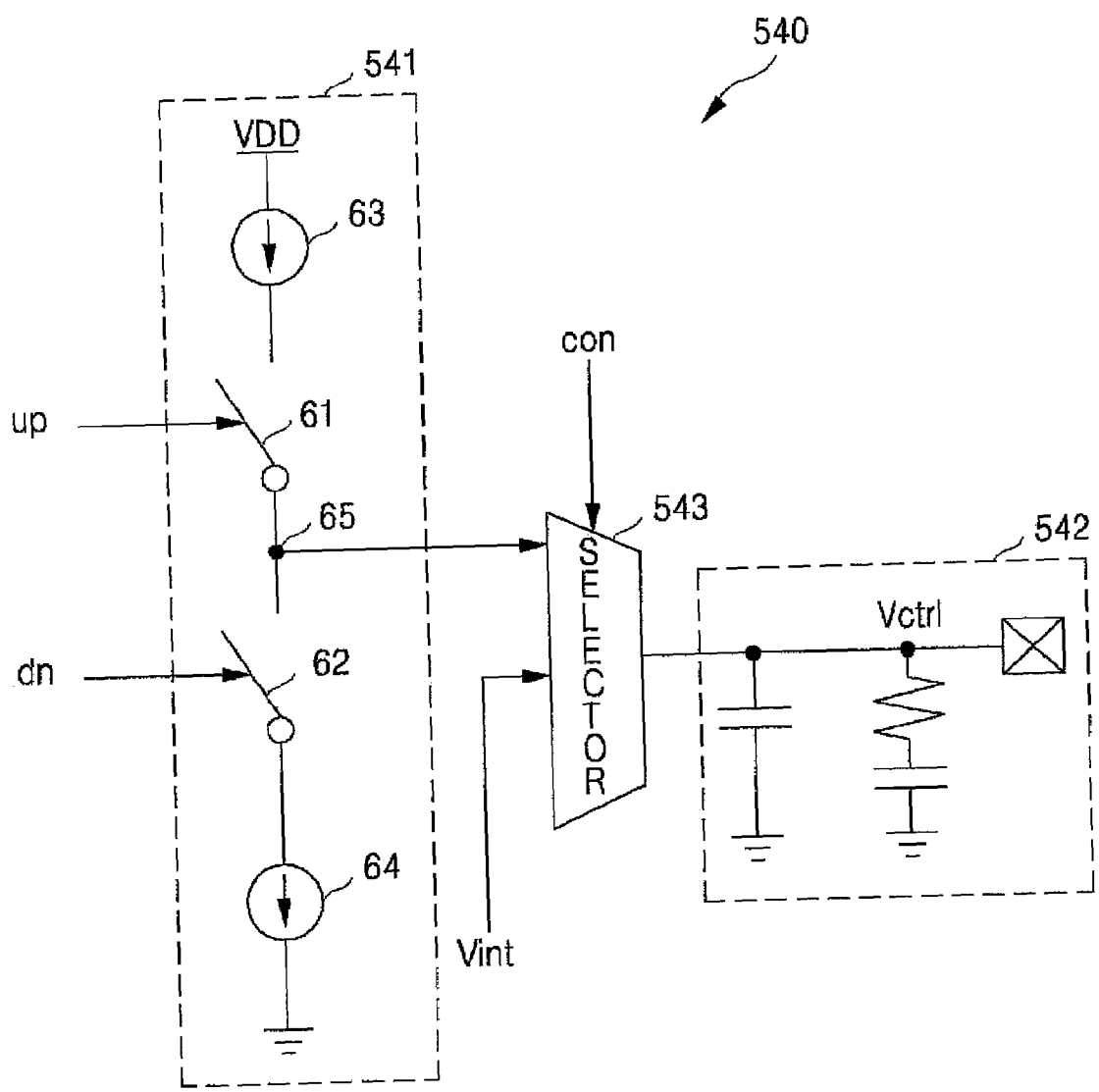
FIG. 6 is a circuit diagram of a control voltage generator according to one or more embodiments of the present invention.

FIG. 6 is a circuit diagram of the control voltage generator 540 shown in FIG. 5 according to one or more embodiments of the present invention. Referring to FIG. 6, the control voltage generator 540 includes a charge pump 541, a loop filter 542, and a selector 543.

The charge pump 541 performs charge pumping in response to the "up" signal and the "dn" signal. In operation, when the "up" signal is at a high level, a switch 61 is turned on and current is supplied from a current source 63 via the selector 543 to one or more capacitive elements of the loop filter 542, thus increasing the control voltage Vctrl. When the "dn" signal is at a high level, a switch 62 is turned on and current is discharged by a current source 64 from the one or more capacitive elements of the loop filter 542 via the selector 543, thus decreasing is the control voltage Vctrl. The switches 61 and 62 may, for example, be implemented by a PMOS transistor and an NMOS transistor, respectively. In addition, the current sources 63 and 64 may, for example, also be implemented by a PMOS transistor and an NMOS transistor, respectively.

The loop filter 542 functions as a low-pass filter which removes alternating current (AC) components from the control voltage Vctrl.

The selector 543 is responsive to the control signal "con" to selectively outputs to the loop filter 542 either the initial control voltage Vint generated by the control voltage initializer 530 or an output of the charge pump 541.

When an output node 65 of the charge pump 541 is connected with the loop filter 542 through the selector 543, the level of the control voltage Vctrl is controlled by the charge pump 541. The control signal "con" is generated based on a power-on signal of the DLL 500 and allows the initial control voltage Vint output from the control voltage initializer 530 to be selected as a control voltage with which the DLL 500 initiates operation. The selector 543 may be implemented by a multiplexer or a switching circuit, but the present embodiment is not restricted thereto.

Figure 7:
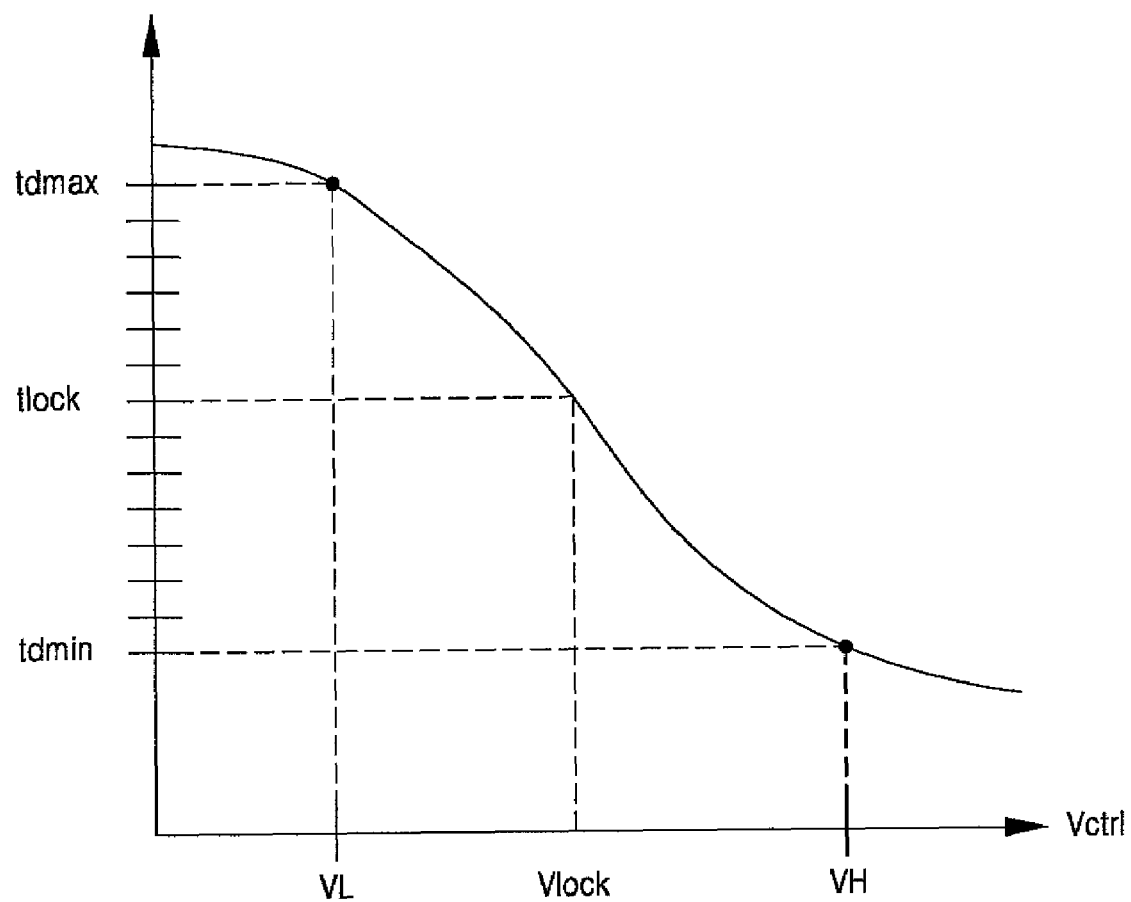
FIG. 7 is a graph illustrating delay characteristics of an output clock signal with respect to a control voltage according to one or more embodiments of the present invention.

FIG. 7 is a graph illustrating delay characteristics of the output clock signal clk_out with respect to the control voltage Vctrl according to one or more embodiments of the present invention.

As will be explained in more detail later, control voltage initializer 530 generates a first digital code and a second digital code, which respectively correspond to a minimum delay time tdmin and a maximum delay time tdmax. Referring to FIG. 7, the minimum delay time tdmin occurs when the control voltage Vctrl is at a maximum delay voltage VH, and the maximum delay time tdmax occurs when the control voltage Vctrl is at a minimum delay voltage VL. Further, a locking delay time tlock occurs when the control voltage Vctrl is at an intermediate locking delay voltage Vlock.

The control voltage initializer 530 compares the first digital code and the second digital code with a locking digital code corresponding to the locking delay time tdlock, and outputs the initial control voltage Vint which is equal to or closely approximates a locking control voltage Vlock which enables a locking state of the output clock signal clk_out.

Figure 8:
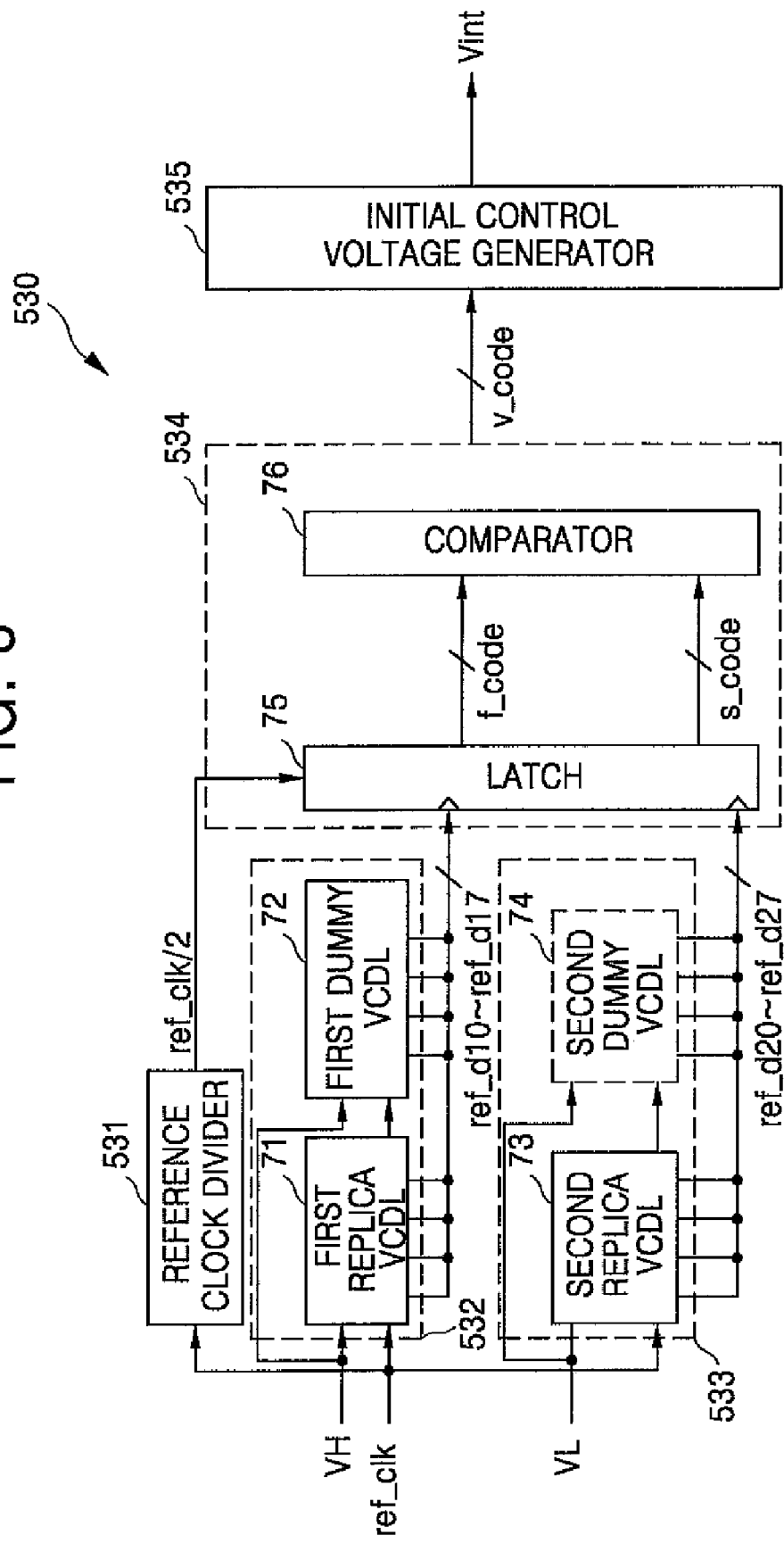
FIG. 8 is a block diagram of a control voltage initializer according to one or more embodiments of the present invention.

FIG. 8 is a block diagram of the control voltage initializer 530 according to one or more embodiments of the present invention. The control voltage initializer 530 includes a reference clock divider 531, a first replica VCDL circuit 532, a second replica VCDL circuit 533, a code generator 534, and an initial control voltage generator 535.

The reference clock divider 531 receives the reference clock signal ref_clk and divides it by 2, thereby outputting a divided reference clock signal ref_clk/2.

The first replica VCDL circuit 532 includes a first replica VCDL 71 and a first dummy VCDL 72. Like the VCDL 510 illustrated in FIG. 5, each of the first replica VCDL 71 and the first dummy VCDL 72 includes plural delay elements which are connected in series. In the example that follows, each of the first replica VCDL 71 and the first dummy VCDL 72 includes four delay elements, although the embodiments is not limited thereto. The eight delay elements included in the first replica VCDL 71 and the first dummy VCDL 72 respectively output first reference clock delay signals ref_d10 through ref_d17, each having different phases, based on the minimum delay voltage VH of the control voltage Vctrl which may be applied to the VCDL 510 in order to minimize the delay of the reference clock signal ref_clk.

The second replica VCDL circuit 533 includes a second replica VCDL 73 and a second dummy VCDL 74 which each include four (in this example) delay elements connected in series. The eight delay elements included in the second replica VCDL 73 and the second dummy VCDL 74 respectively output second reference clock delay signals ref_d20 through ref_d27, each having different phases, based on the maximum delay voltage VL of the control voltage Vctrl which may be applied to the VCDL 510 in order to maximize the delay of the reference clock signal ref_clk.

Still referring to FIG. 8, the code generator 534 includes a latch 75 and a comparator 76. As described in detail below, the code generator 534 receives the divided reference clock signal ref_clk/2, the first reference clock delay signals ref_d10 through ref_d17, and the second reference clock delay signals ref_d20 through ref_d27, and generates and outputs an initial voltage digital code v_code.

In particular, the latch 75 outputs a first digital code f_code and a second digital code s_code by sampling the divided reference clock signal ref_clk/2 in synchronization with the first reference clock delay signals ref_d10 through ref_d17 and the second reference clock delay signals ref_d20 through ref_d27. The first digital code f_code and the second digital code s_code may be thermometer codes.

Figure 9:
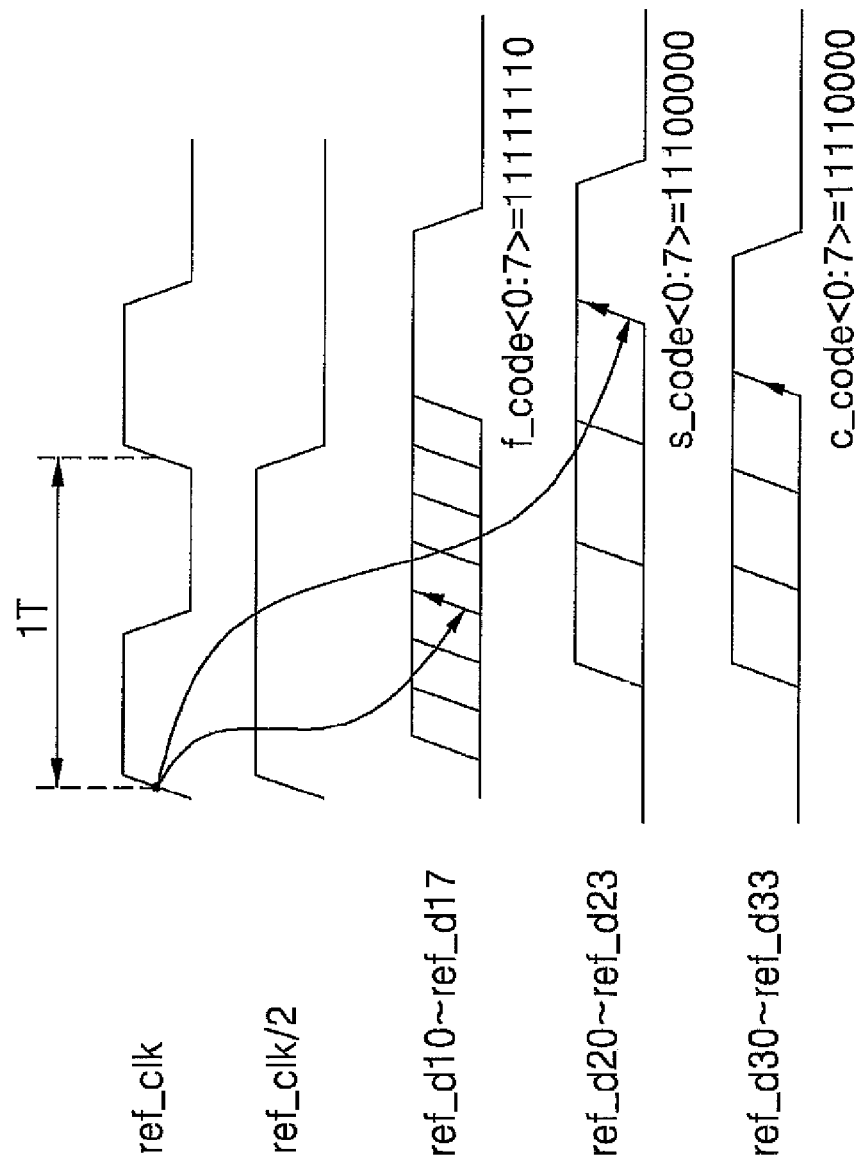
FIG. 9 illustrates digital codes with respect to reference clock delay signals according to one or more embodiments of the present invention.

FIG. 9 illustrates the digital codes f_code and s_code with respect to the reference clock delay signals ref_d10 through ref_d17 and ref_d20 through ref_d27 according to one or more embodiments of the present invention.

Referring to FIGS. 8 and 9, since the VCDL 510 controlled by the minimum delay voltage VH outputs the output clock signal clk_out having a phase which leads a phase of the reference clock signal ref_clk, rising edges of the first reference clock delay signals ref_d10 through ref_d13 respectively output from the four delay elements included in the first replica VCDL 71 exist within a single clock cycle 1T of the reference clock signal ref_clk. Rising edges of the first reference clock delay signals ref_d14 through ref_d16 output from the first three delay elements among the four delay elements included in the first dummy VCDL 72 exist within the single clock cycle 1T and the first reference clock delay signal ref_d17 output from the last delay element of the first dummy VCDL 72 exists outside the single clock cycle 1T. Accordingly, when the divided reference clock signal ref_clk/2 is sampled in synchronization with the rising edges of the respective first reference clock delay signals ref_d10 through ref_d17, the first digital code f_code has a value of 11111110. The first digital code f_code may correspond to the minimum delay time tdmin with respect to the reference clock signal ref_clk for the output clock signal clk_out.

Since the VCDL 510 controlled by the minimum delay voltage VH outputs the output clock signal clk_out having a phase which leads a phase of the reference clock signal ref_clk, a value of the upper four bits in the first digital code f_code, which are generated by the first reference clock delay signals ref_d10 through ref_d13 output from the first replica VCDL 71 is always 1111. However, a value of the lower four bits of the first digital code f_code generated by the first reference clock delay signals ref_d14 through ref_d17 output from the first dummy VCDL 72 may be different according to the delay characteristics of the VCDL 510.

Since the VCDL 510 controlled by the maximum delay voltage VL outputs the output clock signal clk_out having a phase lagging behind a phase of the reference clock signal ref_clk, rising edges of the second reference clock delay signals ref_d20 and ref_d21 output from the first two delay elements among the four delay elements included in the second replica VCDL 73 exist within the single clock cycle 1T, and rising edges of the second reference clock delay signals ref_d22 and ref_d23 output from the last two delay elements exist after the single clock cycle 1T. Rising edges of the second reference clock delay signals ref_d24 through ref_d27 output from the four delay elements included in the second dummy VCDL 74 exist after the single clock cycle 1T. Digital bits, i.e., lower four bits of the second digital code s_code, respectively generated by the rising edges of the respective second reference clock delay signals ref_d24 through ref_d27 are set to a value of "0" so that the second digital code s_code can be easily compared with the first digital code f_code. Accordingly, the second dummy VCDL 74 may be omitted to optimize the hardware configuration. As a result, the second digital code s_code generated by the second reference clock delay signals ref_d20 through ref_d27 has a value of 11000000. The second digital code s_code may correspond to the maximum delay time tdmax with respect to the reference clock signal ref_clk for the output clock signal clk_out.

The second reference clock delay signals ref_d20 through ref_d23 output from the second replica VCDL 73 change according to the delay characteristics of the VCDL 510. Thus, the upper four bits of the second digital code s_code generated by the second reference clock delay signals ref_d20 through ref_d23 may change.

A locking digital code c_code corresponding to the locking delay time tdlock may be generated using the principle of generating the first digital code f_code and the second digital code s_code. Rising edges of respective signals ref_d30 through ref_d33 respectively output from delay elements included in a predetermined replica VCDL, which receives a locking delay voltage, exist within the single clock cycle 1T. In addition, rising edges of respective signals ref_d34 through ref_d37 respectively output from delay elements included in a predetermined dummy VCDL, which receives the locking delay voltage, exist after the single clock cycle 1T. Accordingly, the locking digital code c_code generated by the signals ref_d30 through ref_d37 output from the replica VCDL and the dummy VCDL, which receive the locking delay voltage, may be 11110000. The replica VCDL and the dummy VCDL may not need to be realized in hardware but may be predetermined in firmware in the comparator 76. For example, when the locking digital code c_code has N bits (where N is 2 or an even number greater than 2), the upper N/2 bits may be set to "1" and the lower N/2 bits may be set to "0".

The comparator 76 compares the predetermined locking digital code c_code with the first digital code f_code and the second digital code s_code, which are output from the latch 75, and generates and outputs the initial voltage digital code v_code.

Figure 10:
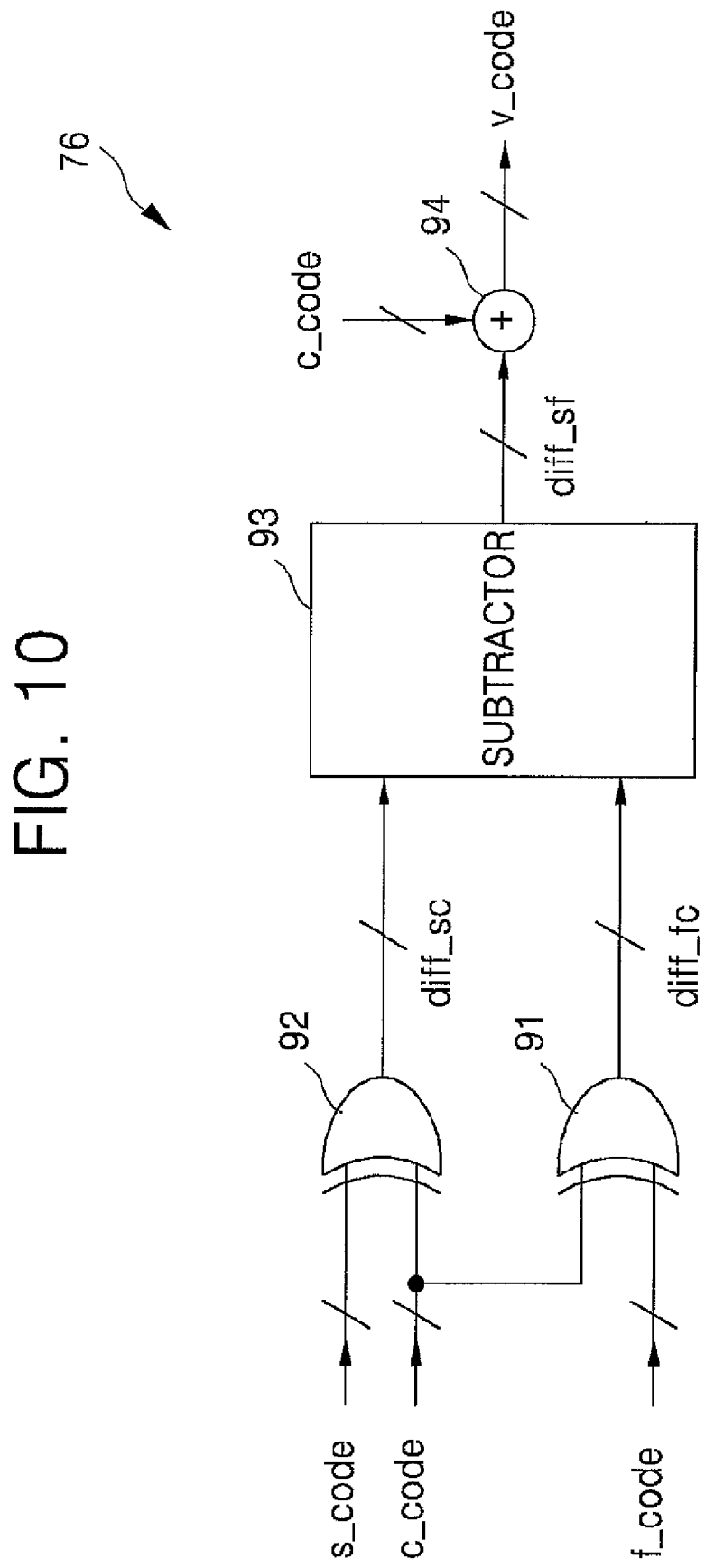
FIG. 10 is a circuit diagram of a comparator included in a code generator according to one or more embodiments of the present invention.

FIG. 10 is a circuit diagram of the comparator 76 included in the code generator 534 according to one or more embodiments of the present invention. Referring to FIG. 10, the comparator 76 includes a first XOR gate 91, a second XOR gate 92, a subtractor 93, and an adder 94.

The first XOR gate 91 outputs a third digital code diff_fc by performing an XOR operation on the locking digital code c_code and the first digital code f_code. Accordingly, the third digital code diff_fc is indicative of a difference between the locking digital code c_code and the first digital code f_code with respect to the number of bits having a value of 1. For example, when the locking digital code c_code is 11110000 and the first digital code f_code is 11111110, the third digital code diff_fc is 00001110 and the difference between the locking digital code c_code and the first digital code f_code is 3, which is the number of 1s in the third digital code diff_fc.

The second XOR gate 92 outputs a fourth digital code diff_sc by performing an XOR operation on the locking digital code c_code and the second digital code s_code. The fourth digital code diff_sc is indicative a difference between the locking digital code c_code and the second digital code s_code with respect to the number of bits having a value of 1. For example, when the locking digital code c_code is 11110000 and the second digital code s_code is 11000000, the fourth digital code diff_sc is 00110000 and the difference between the locking digital code c_code and the second digital code s_code is 2, which is the number of 1s in the fourth digital code diff_sc.

The subtractor 93 outputs a fifth digital code diff_sf by subtracting the third digital code diff_fc from the fourth digital code diff_sc. For example, when the fourth digital code diff_sc is 00110000 and the third digital code diff_fc is 00001110, the fourth digital code diff_sc indicates a value of 2 and the third digital code diff_fc indicates a value of 3, and therefore, the fifth digital code diff_sf indicates a value of −1.

Accordingly, the fifth digital code diff_sf may be a predetermined digital code such as a binary code indicating a value of −1.

The adder 94 outputs as the initial voltage digital code v_code a result of adding the locking digital code c_code and the fifth digital code diff_sf output from the subtractor 93. For instance, when the fifth digital code diff_sf indicates a value of −1 and the locking digital code c_code is 11110000, since the locking digital code c_code indicates a value of 4 as a thermometer code, the initial voltage digital code v_code may be a predetermined digital code indicating a value of 3.

Figure 11:
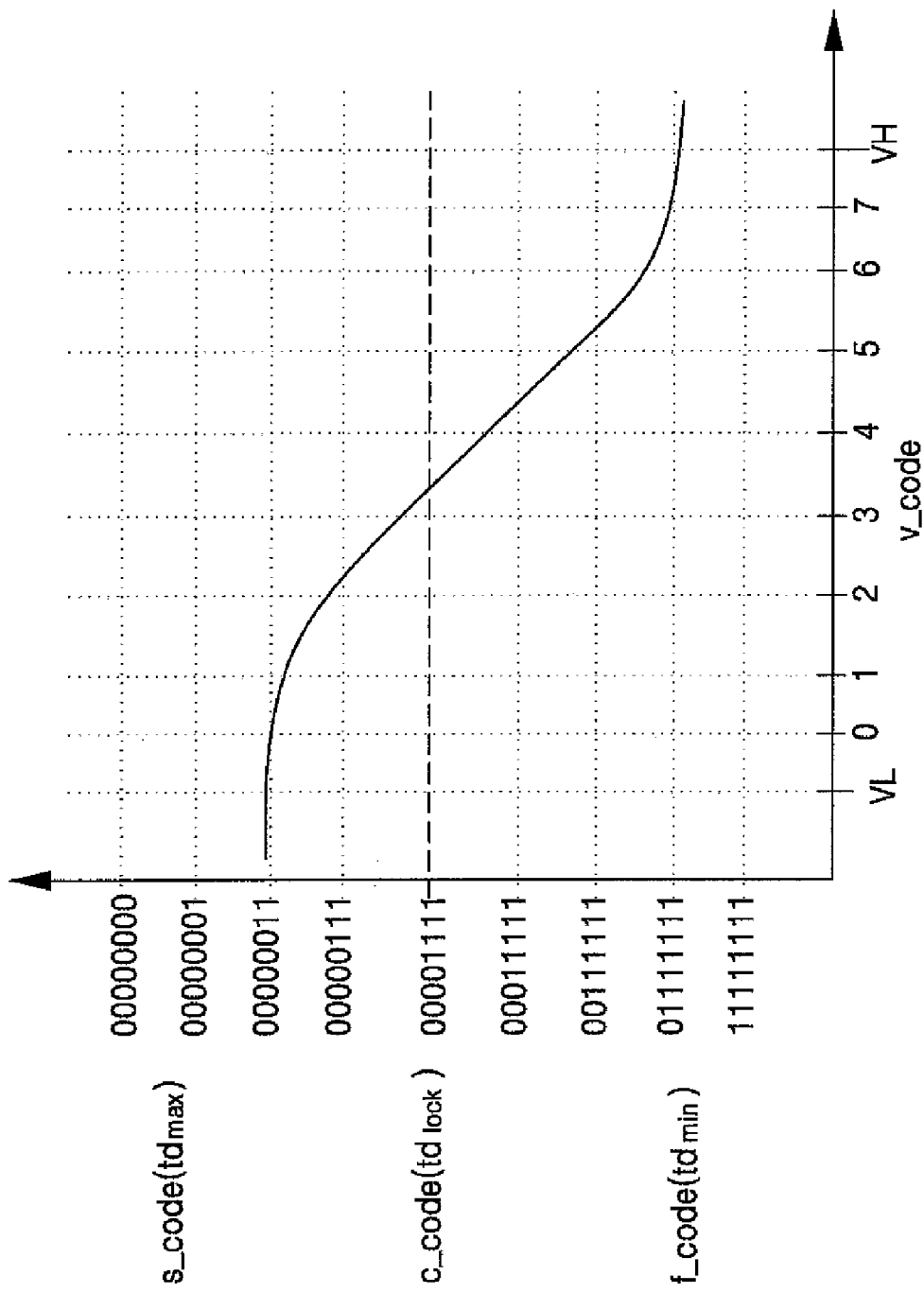
FIG. 11 is a graph for describing the manner in which an initial voltage digital code is matched with a locking digital code in a code generator, according to one or more embodiments of the present invention.

FIG. 11 is a graph for describing the manner in which the initial voltage digital code v_code is matched with the locking digital code c_code in the code generator 534. Referring to FIG. 11, when the first digital code f_code is 11111110 and the second digital code s_code is 11000000, the initial voltage digital code v_code indicating a value of 3 output from the code generator 534 closely approximates the locking digital code c_code corresponding to the locking delay time tdlock.

The initial control voltage generator 535 receives the initial voltage digital code v_code and generates the initial control voltage Vint.

Figure 12:
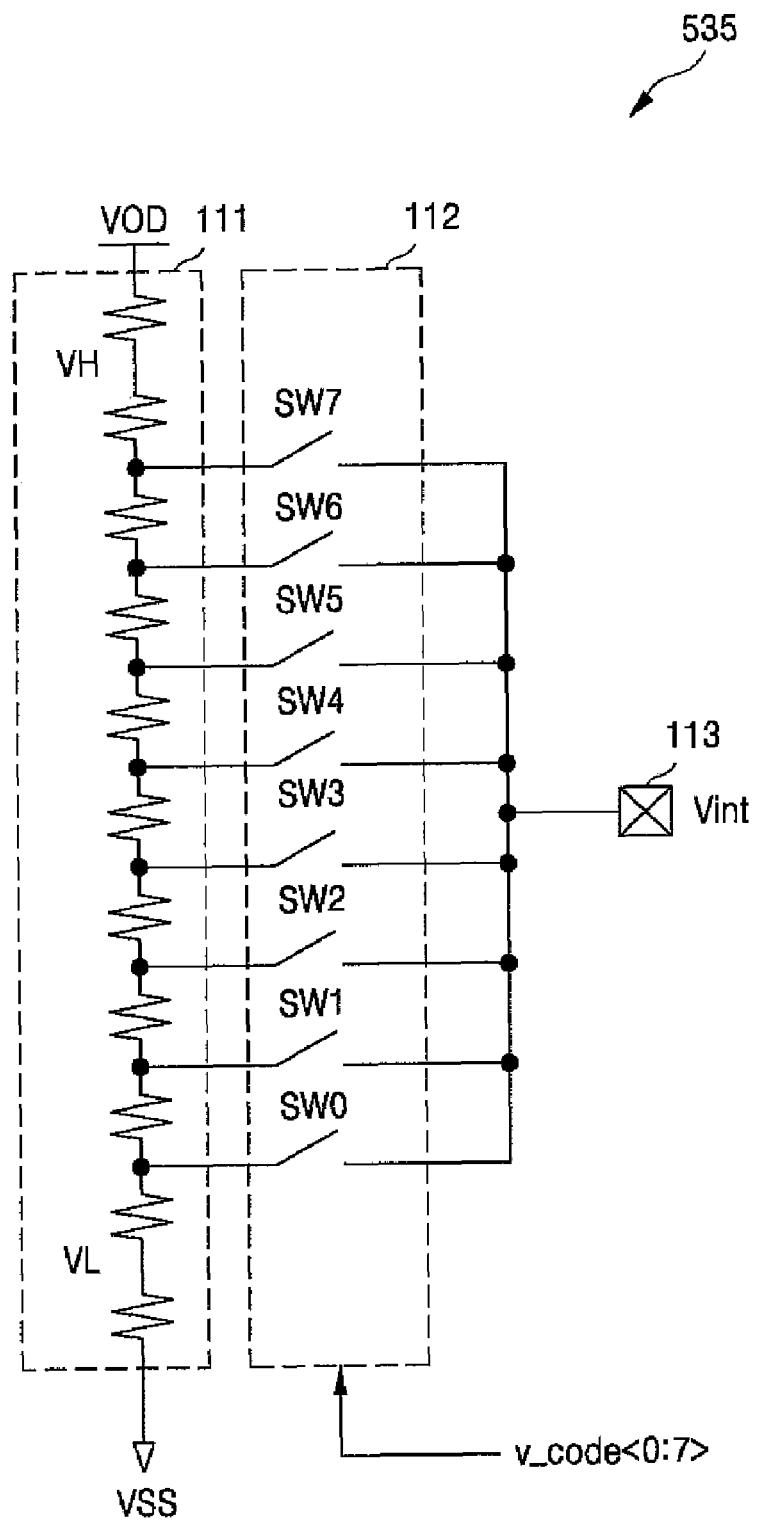
FIG. 12 is a circuit diagram of an initial control voltage generator according to one or more embodiments of the present invention.

FIG. 12 is a circuit diagram of the initial control voltage generator 535 according to one or more embodiments of the present invention. Referring to FIG. 12, the initial control voltage generator 535 includes a resistor string 111 including a plurality of resistors, which are connected in series between a first power supply terminal VDD and a second power supply terminal VSS, and a plurality of switches 112, each of which is connected between a corresponding connection point between adjacent resistors and an initial control voltage terminal 113.

The resistor string 111 may determine a resistance value of each of the resistors based on the delay characteristics of the output clock signal clk_out, which is output from the VCDL 510 according to the control voltage Vctrl. The delay characteristics may include the non-linearity of the output clock signal clk_out depending on the minimum delay voltage VH, the maximum delay voltage VL, and the control voltage Vctrl.

The number of switches SW0 through SW7 of the plurality of the switches 112 is the same as the number of bits (e.g., 8) in each of the first digital code f_code and the second digital code s_-code. The switches 112 are controlled by the initial voltage digital code v_code. For instance, when the initial voltage digital code v_code indicates 3, the switch SW3 is turned on and the remaining switches SW0 through SW2 and SW4 through SW7 are turned off. The initial voltage digital code v_code may be 00010000, in which only fourth bit is 1 and the remaining bits are 0, in order to turn on only the switch SW3 and turn off the remaining switches.

The initial control voltage Vint exactly or closely corresponding to the locking delay time tdlock is applied from a connection point in the resistor string 111, which corresponds to the switch SW3 turned on by the initial voltage digital code v_code<0:7> (i.e., 00010000), to the initial control voltage terminal 113 through the turned-on switch SW3.

Figure 13:
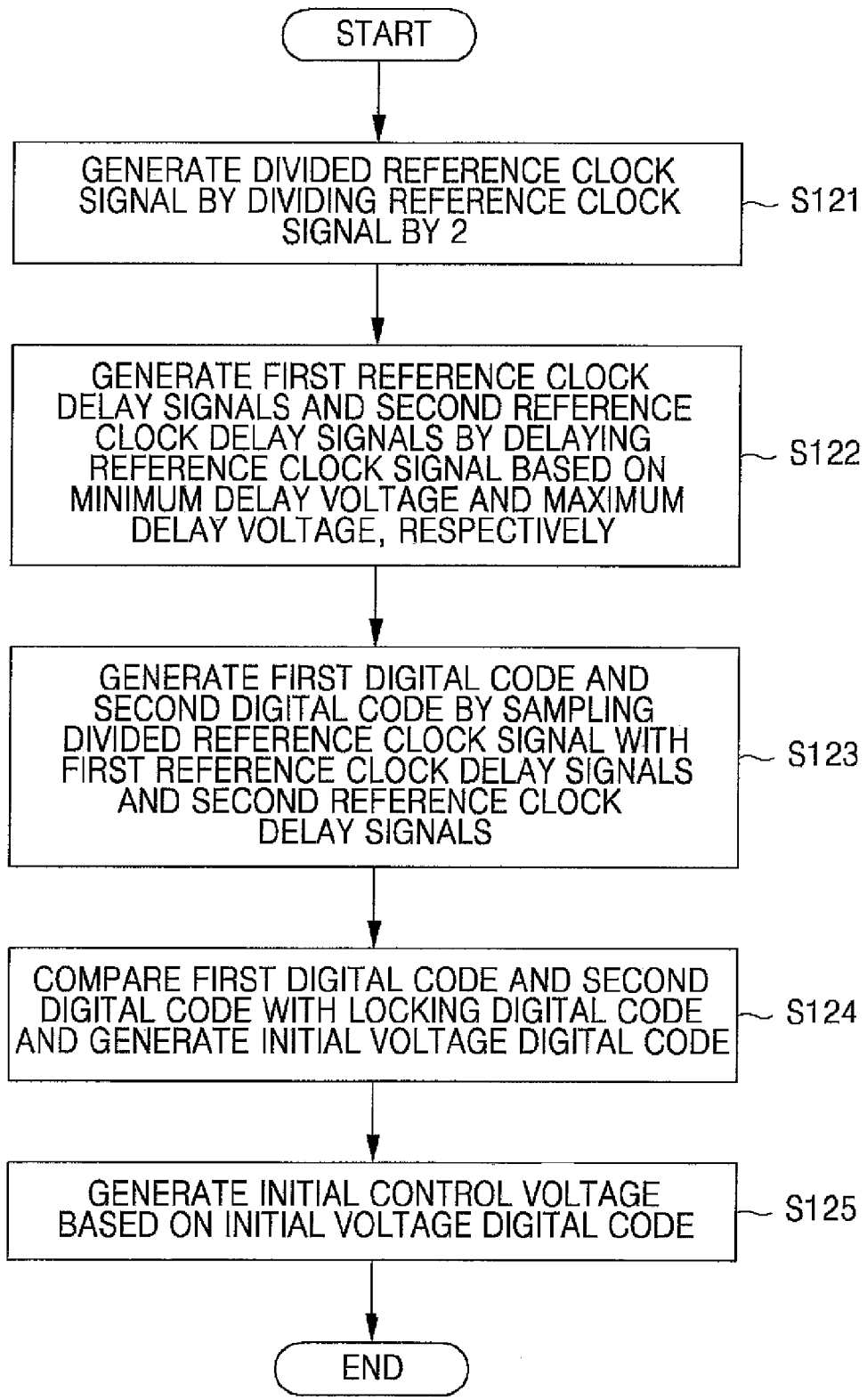
FIG. 13 is a flowchart for describing a method of generating an initial control voltage in a DLL circuit according to one or more embodiments of the present invention.

FIG. 13 is a flowchart for describing a method of generating the initial control voltage Vint in the DLL circuit 500 according to one or more embodiments of the present invention. Referring to FIGS. 8 and 13, in operation S121, the reference clock divider 531 divides the reference clock signal ref_clk by 2 and outputs the divided reference clock signal ref_clk/2.

In operation S122, the first Replica VCDL 532 delays the reference clock signal ref_clk based on the minimum delay voltage VH and outputs the first reference clock delay signals ref_d10 through ref_d17 having different phases while the second Replica VCDL 533 delays the reference clock signal ref_clk based on the maximum delay voltage VL and outputs the second reference clock delay signals ref_d20 through ref_d27 having different phases.

In operation S123, the latch 75 samples the divided reference clock signal ref_clk/2 with the first reference clock delay signals ref_d10 through ref_d17 and the second reference clock delay signals ref_d20 through ref_d27 and generates the first digital code f_code and the second digital code s_code respectively.

In operation S124, the comparator 76 compares the first digital code f_code and the second digital code s_code with the locking digital code c_code and generates the initial voltage digital code v_code.

In operation S125, the initial control voltage generator 535 generates the initial control voltage Vint based on the initial voltage digital code v_code.

According to one or more embodiments of the present invention, delay characteristics of an output clock signal of a VCDL which depend on a control voltage are made into a digital code, and an initial control voltage is applied to the VCDL based on an initial voltage code corresponding to a locking digital code, so that a DLL circuit can quickly reach a locking state and increase a locking range While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A delay locked loop circuit comprising:
a phase detector configured to compare a phase of a reference clock signal with a phase of an output clock signal and to output a comparison signal;
a control voltage generator configured to output a control voltage based on the comparison signal;
a voltage controlled delay line comprising a plurality of delay elements and configured to delay the reference clock signal based on the control voltage and to output the output clock signal; and
a control voltage initializer which includes a first set of delay elements and a second set of delay elements, and which is configured to generate first and second digital codes based on characteristics of the first and second sets of delay elements, and to generate an initial control voltage based on the first and second digital codes,
wherein the characteristics of the first set of delay elements are based on a first constant delay voltage which delays the reference clock signal for a first delay amount, and the characteristics of the second set of delay elements are based on a second constant delay voltage which delays the reference clock signal for a second delay amount.

2. A delay locked loop circuit of claim 1,
wherein the control voltage generator comprises:
a charge pump configured to change a level of the control voltage by performing charge pumping based on the comparison signal;
a loop filter configured to perform low-pass filtering; and
a selector configured to selectively input one of an output from the charge pump and the initial control voltage to the loop filter based on the control signal.

3. A delay locked loop circuit comprising:
a phase detector configured to compare a phase of a reference clock signal with a phase of an output clock signal and to output a comparison signal;

a control voltage generator configured to output a control voltage based on the comparison signal;

a voltage controlled delay line comprising a plurality of delay elements and configured to delay the reference clock signal based on the control voltage and to output the output clock signal; and a control voltage initializer which includes a first set of delay elements and a second set of delay elements, and which is configured to generate first and second digital codes based on characteristics of the first and second sets of delay elements, and to generate an initial control voltage based on the first and second digital codes, wherein the characteristics of the first set of delay elements are based on a minimum delay voltage which minimizes a delay of the reference clock signal, and the characteristics of the second set of delay elements are based on a maximum delay voltage which maximizes the delay of the reference clock signal.

4. The delay locked loop circuit of claim 3, wherein the voltage controlled delay line comprises L first delay elements connected in series, where L is a natural number.

5. The delay locked loop circuit of claim 3, wherein the first digital code is based on the minimum delay voltage and the second digital codes is based on the maximum delay voltage.

6. A delay locked loop circuit comprising:

a phase detector configured to compare a phase of a reference clock signal with a phase of an output clock signal and to output a comparison signal;

a control voltage generator configured to output a control voltage based on the comparison signal;

a voltage controlled delay line comprising a plurality of delay elements and configured to delay the reference clock signal based on the control voltage and to output the output clock signal; and a control voltage initializer configured to generate digital codes based on characteristics of the voltage controlled delay line and to generate an initial control voltage based on the digital codes, wherein the control voltage initializer generates the initial control voltage based on a minimum delay voltage which minimizes a delay of the reference clock signal, and a maximum delay voltage which maximizes the delay of the reference clock signal, and wherein the voltage controlled delay line comprises L first delay elements connected in series, where L is a natural number, and wherein the control voltage initializer comprises:

a reference clock divider configured to divide the reference clock signal by K and to output a divided reference clock signal, where K is 2 or a natural number greater than 2;

a first replica voltage controlled delay line comprising M second delay elements connected in series and configured to receive the reference clock signal and to output first reference clock delay signals from the respective M second delay elements in response to the minimum delay voltage, where M is a natural number;

a second replica voltage controlled delay line comprising N third delay elements connected in series and configured to receive the reference clock signal and to output second reference clock delay signals from the respective N third delay elements in response to the maximum delay voltage, where N is a natural number;

a code generator configured to generate and output an initial voltage digital code based on the divided reference clock signal, the first reference clock delay signals, and the second reference clock delay signals; and an initial control voltage generator configured to generate the initial control voltage in response to the initial voltage digital code.

7. The delay locked loop circuit of claim 6, wherein the code generator comprises:

a latch configured to sample the divided reference clock signal in response to the first reference clock delay signals and the second reference clock delay signals and to output a first digital code and a second digital code; and a comparator configured to compare the first digital code and the second digital code with a locking digital code and to generate the initial voltage digital code.

8. The delay locked loop circuit of claim 7, wherein upper L bits in the locking digital code are preset to a value of 1 and lower L bits in the locking digital code are preset to a value of 0, and wherein lower L bits in the second digital code are preset to 0.

9. The delay locked loop circuit of claim 6, wherein the second delay elements and the third delay elements have the same delay characteristics as the first delay elements.

10. The delay locked loop circuit of claim 6, wherein K is 2 and each of the first and second digital codes is a thermometer code having 2 L bits.

11. The delay locked loop circuit of claim 6, wherein the initial control voltage generator comprises:

a plurality of resistors connected in series between a first power supply terminal and a second power supply terminal; and a plurality of switches connected between respective corresponding connection points among the plurality of resistors and an initial control voltage terminal, and configured to respond to the third digital code.

12. A method of generating a clock signal in a delay locked loop circuit, the method comprising:

comparing a phase of a reference clock signal with a phase of an output clock signal, and outputting a comparison signal;

outputting a pre-control voltage based on the comparison signal;

generating an initial control voltage based on first and second digital codes generated in response to the reference clock signal, a minimum delay voltage, and a maximum delay voltage, wherein the reference clock signal and the minimum delay voltage is applied to a first set of delay elements, and the reference clock signal and the maximum delay voltage are applied to a second set of delay elements; and outputting the output clock signal by delaying the reference clock signal in response to one of the pre-control voltage and the initial control voltage.

13. A method of generating a clock signal in a delay locked loop circuit, the method comprising:

comparing a phase of a reference clock signal with a phase of an output clock signal, and outputting a comparison signal;

outputting a pre-control voltage based on the comparison signal;

generating an initial control voltage based on a digital code generated in response to the reference clock signal, a minimum delay voltage, and a maximum delay voltage; and outputting the output clock signal by delaying the reference clock signal in response to one of the pre-control voltage and the initial control voltage, wherein generating the initial control voltage comprises:

outputting a divided reference clock signal by dividing the reference clock signal;

outputting first reference clock delay signals having different phases by delaying the reference clock signal in response to the minimum delay voltage;

outputting second reference clock delay signals having different phases by delaying the reference clock signal in response to the maximum delay voltage;

generating a first digital code and a second digital code by sampling the divided reference clock signal with the first reference clock delay signals and the second reference clock delay signals;

comparing the first digital code and the second digital code with a locking digital code and generating an initial voltage digital code; and generating the initial control voltage based on the initial voltage digital code.

14. The method of claim 13, wherein the first digital code and the second digital code respectively correspond to a minimum delay time and a maximum delay time of the delay locked loop circuit.

15. The method of claim 13, further comprising setting the locking digital code such that the locking digital code corresponds to a locking delay time for the output clock signal to be synchronized with the reference clock signal.

16. The method of claim 13, wherein comparing the first and second digital codes with the locking digital code and generating the initial voltage digital code comprises:

generating a third digital code and a fourth digital code by performing an XOR operation on each of the first and second digital codes and the locking digital code;

generating a fifth digital code by subtracting the third digital code from the fourth digital code; and generating the initial voltage digital code by adding the fifth digital code and the locking digital code.

* * * * *